(12) United States Patent
Ueda (10) Patent No.: US 10,135,435 B2
(45) Date of Patent: Nov. 20, 2018

(54) SWITCHING DEVICE WITH SURGE RECIRCULATION DEVICE AND SURGE RECIRCULATION LINE

(71) Applicant: Renesas Electronics Corporation, Tokyo (JP)

(72) Inventor: Takehiro Ueda, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/797,062

(22) Filed: Oct. 30, 2017

(65) Prior Publication Data

US 2018/0159525 A1 Jun. 7, 2018

(30) Foreign Application Priority Data

Dec. 5, 2016 (JP) ................. 2016-235719

(51) Int. Cl.
*H03K 17/16* (2006.01)
*H02M 1/34* (2007.01)
*H02M 7/5387* (2007.01)

(52) U.S. Cl.
CPC ............ *H03K 17/168* (2013.01); *H02M 1/34* (2013.01); *H02M 7/53871* (2013.01); *H03K 2217/0045* (2013.01)

(58) Field of Classification Search
CPC combination set(s) only.
See application file for complete search history.

(56) References Cited

U.S. PATENT DOCUMENTS

| 7,161,331 | B2 * | 1/2007 | Wai ........................ | H02M 1/34 323/222 |
| 8,912,768 | B1 * | 12/2014 | Cho ...................... | H02M 3/156 323/222 |
| 9,231,466 | B2 | 1/2016 | Hayashiguchi | |
| 9,935,625 | B2 * | 4/2018 | Yamaguchi ...... | H03K 17/08122 |

FOREIGN PATENT DOCUMENTS

JP 2013-066349 A 4/2013

* cited by examiner

*Primary Examiner* — An Luu
(74) *Attorney, Agent, or Firm* — Sughrue Mion, PLLC (57) ABSTRACT

A high side transistor is coupled between a high potential side power source node and an intermediate node, and a recirculation diode is coupled between a low potential side power source node and the intermediate node, thereby forming a recirculation path when the high side transistor is OFF. A power source supply line couples the high potential side power source node with one end of the high side transistor. A surge recirculation device causes a current to flow in one direction, and a surge recirculation line couples the one end of the high side transistor to the high potential side power source node through the surge recirculation device, and causes a surge generated at the one end of the high side transistor to recirculate toward the high potential side power source node.

16 Claims, 11 Drawing Sheets

SWITCHING DEVICE WITH SURGE RECIRCULATION DEVICE AND SURGE RECIRCULATION LINE

CROSS-REFERENCE TO RELATED APPLICATIONS

The disclosure of Japanese Patent Application No. 2016-235719 filed on Dec. 5, 2016 including the specification, drawings and abstract is incorporated herein by reference in its entirety.

The present invention relates to a switching device, and relates to a technique for a converter device or an inverter device for use, for example, in power electronics.

BACKGROUND

Japanese Unexamined Patent Application Publication No. 2013-66349 discloses a technique for reducing the surge voltage at the time of turning off a MOSFET (Metal Oxide Semiconductor Field Effect Transistor), in three-phase inverters or H bridge circuits. Specifically, a snubber circuit (a capacitor) is coupled between a power source terminal as an end of a series circuit formed of two MOSFETs and a power source terminal as the other end thereof.

SUMMARY

For example, it is not always possible that two power source terminals in a switching device (a three-phase inverter or H bridge circuit) can be arranged in the vicinity of each other, in accordance with the mounting form of each device. When there is a certain distance between the two power source terminals, a leading wiring for coupling between the two power source terminals includes a relatively large parasitic inductance component, if the snubber circuit of Japanese Unexamined Patent Application Publication No. 2013-66349 is used.

In this case, a charging/discharging current for the snubber circuit (a capacitor) in accordance with the occurrence of surge is inhibited by the parasitic inductance component of the leading waring, thus undesirably resulting in the insufficient surge reduction effect. Particularly, when a high speed transistor (a GaN (gallium nitride) transistor or SiC (silicon carbide)) is used as a power transistor used for the switching device, a large charging/discharging current needs to flow through the capacitor in a short period of time. Thus, the surge reduction effect can hardly be attained.

Preferred embodiments as will be described later have been made in consideration of the above. Other objects and new features will be apparent from, the following description of the present specification and the accompanying drawings.

A switching device according to an embodiment includes a surge recirculation device and a surge recirculation line, in addition to a switching transistor, a recirculation device, and a power source supply line. The switching transistor is coupled between a first power source node and an intermediate node, and the recirculation device is coupled between a second power source node and the intermediate node, thereby forming a recirculation path when the switching transistor is OFF. The power source supply line couples the first power source node to one end of the switching transistor. The surge recirculation device causes a current to flow in one direction, and the surge recirculation line couples the one end of the switching transistor to the first power source node through the surge recirculation device, thereby causing a surge generated at the one end of the switching transistor to recirculate toward the first power source node.

According to the embodiment, it is possible to realize a reduction in the surge.

DETAILED DESCRIPTION

In the following preferred embodiments, if necessary for convenience sake, descriptions will be made to divided plural sections or preferred embodiments, however, unless otherwise specified, they are not mutually irrelevant, but one is in relations of modifications, application examples, details, supplementary explanations of a part or whole of the other. Further, in the following preferred embodiments, in the case of reference to the number of an element (including its quantity, numeric value, amount, range), unless otherwise specified and unless clearly limited in principle, the present invention is not limited to the specified number, and a number over or below the specified one may be used.

In the following preferred embodiments, the constituent elements (including the element steps) are not necessarily indispensable, unless otherwise specified and unless considered that they are obviously required in principle. Similarly, in the following preferred embodiments, in the reference of the forms of the constituent elements or the positional relationships, they intend to include those approximating or similar substantially to the forms and like, unless otherwise specified and unless considered that they are obviously not required in principle. This is also true of the foregoing numerical values and the range.

Descriptions will new be made to preferred embodiments with reference to the accompanying drawings. In the entire illustrations for describing the preferred embodiments, the same constituent elements are identified by the same reference symbols, and thus will not be described over and over.

EMBODIMENT 1

<Scheme and Problem of Switching Device (Comparative Example)>

Figure 10:
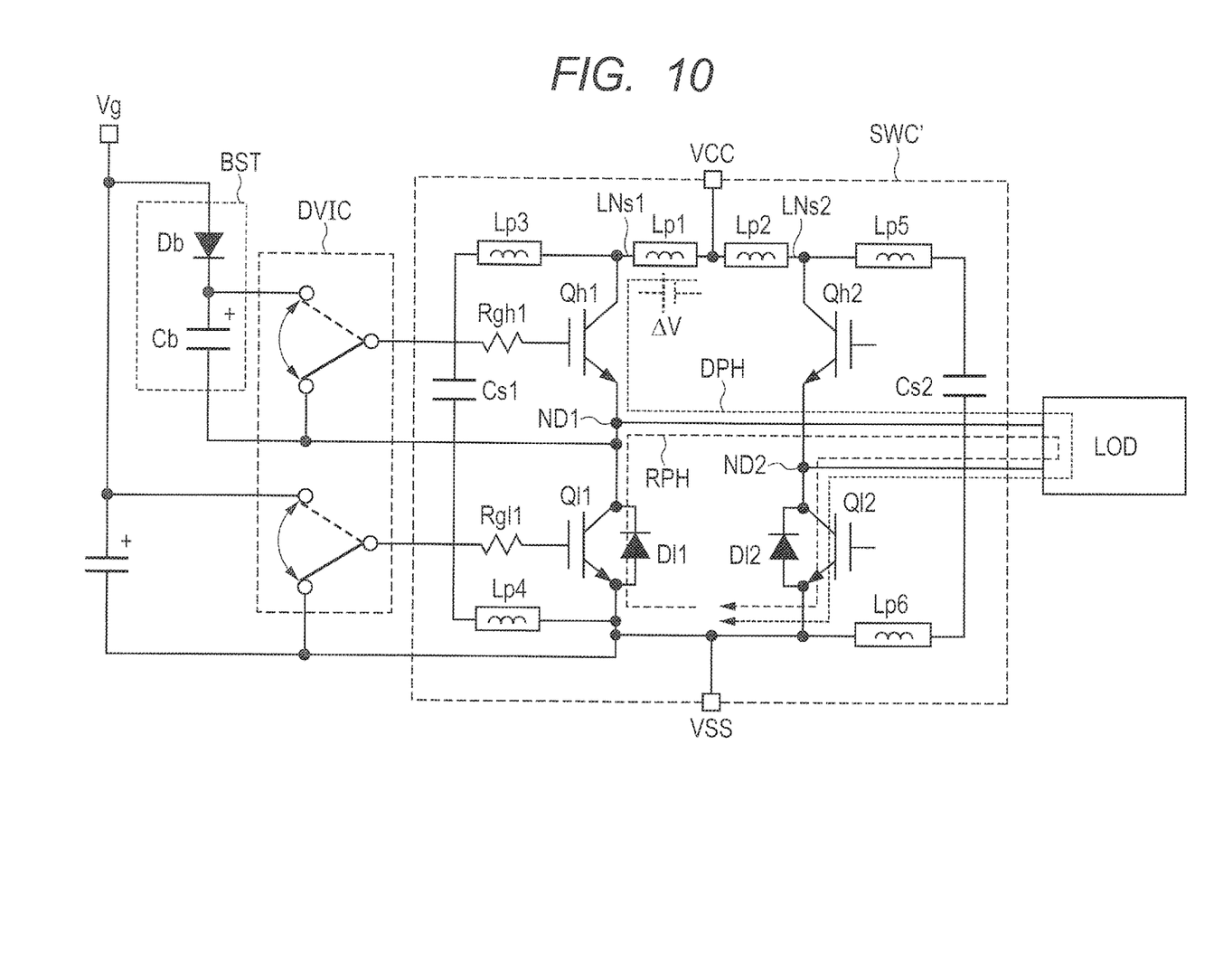
FIG. 10 is a schematic diagram illustrating a configuration example and an operational example of the main part of a switching device as a comparative example of the present invention.

Descriptions will now be made to a switching device as a comparative example, prior to the descriptions of a switching device of an embodiment 1.FIG. 10 is a schematic diagram, illustrating a configuration example and an operational example of the main part of a switching device as a comparative example of the present invention. The switching device illustrated in FIG. 10 includes a switching circuit SWC, a driver device DVTC, a bootstrap circuit BST, and a load device LOD. In this example, the switching circuit SWC is an H bridge circuit including high-side transistors Qh1 and Qh2 and low side transistors Q11 and Q12, and functions as a DC/AC converter circuit.

Though not limited, the high side transistors Qh1 and Qh2 and the low side transistors Q11 and Q12 are formed of any of a MOSFET, an IGBT (Insulated Gate Bipolar Transistor), a GaN transistor, and a SiC transistor. In this case, each transistor includes three terminals of the gate, the source (or the emitter), and the drain (or the collector). However, in this specification, for convenience of explanation, the transistor includes the gate, the source, and the drain.

The high side transistors Qh1 and Qh2 are coupled between a high potential side power source node VCC and intermediate nodes ND1 and ND2, as the drain on the side of the high potential side power source node VCC and as the source on the side of the intermediate nodes ND1 and ND2. The low side transistors Q11 and Q12 are coupled between a low potential side power source node VSS and the intermediate nodes ND1 and ND2, as the drain on the side of the intermediate nodes ND1 and ND2 and as the source on the side of the low potential side power source node VSS. Recirculation diodes D11 and D12 are parallelly coupled respectively to the low side transistors Q11 and Q12. In this specification, the voltage of the high potential side power source node VCC is referred to as a VCC level, while the voltage of the low potential side power source node VSS is referred to as a VSS level. For example, the VSS level is 0 V, and the VCC level is several dozen V or several hundred V, or may exceed 1000 V in some case.

The load device LQD is coupled to the intermediate nodes ND1 and ND2, and is representatively a motor. In this case, it is assumed that the switching of the gate of the high side transistor Qh1 is controlled using a PWM (Pulse Width Modulation) signal, in a state where the low side transistor Q12 is driven on. In this manner, the transistor which is controlled and switched in accordance with the PWM signal is called a switching transistor.

In a period in which the high side transistor (a switching transistor) Qh1 is ON, a driving current flows through a driving path DPH of VCC→Qh1→ND1→LOD→ND2→Q12→VSS. In a period in which the high side transistor Qh1 is OFF, a recirculation current flows through a recirculation path RPH of ND2→Q12→D11→ND1→LOD, using the load device LOD (equivalently, a coil) as an electromotive force. The diode D11 is a recirculation device for forming the recirculation path RPH. When the load device LOD is a motor, the motor is normally rotated, by this operation.

At this operation, the low side transistor Q11 functions as a recirculation device in addition to the diode D11. Thus, the high side transistor Qh1 and the low side transistor Q11 maybe controlled in accordance with complementary PWM signals (so-called synchronous rectification may be performed). When the motor is reversely rotated (that is, when a current flows from the node ND2 to the node ND1), similarly, the switching of the gate of the high side transistor (a switching transistor) Qh2 may be controlled using a PWM signal, in a state where the low side transistor Q11 is driven on.

The driver device DVIC drives the gate of the high side transistor Qh1 and the gate of the low side transistor Q11, respectively through the gate resistance elements Rgh1 and Rg11. Gate resistance elements Rgh1 and Rg11 have a role of controlling a switching period of the transistor and a role of preventing oscillation. Though not illustrated in FIG. 10, the gates of the high side transistor Qh2 and the low side transistor Q12 are similarly driven.

The bootstrap circuit BST includes a bootstrap diode Db and a bootstrap capacitor Cb, and generates a gate voltage when the driver device DVIC drives the high side transistor Qh1 on. Specifically, a gate voltage Vg (for example, 15V) is held through the bootstrap diode Db in the bootstrap capacitor Cb, using a voltage (in this case, approximately VSS level) of the node ND1 as a reference, in a period of the recirculation path RPH. The driver device DVIC drives the high side transistor Qh1 on using the gate voltage Vg held in the corresponding bootstrap capacitor Cb, using the voltage (in this case, approximately VCC level) of the node ND1 as a reference, in a period of a driving path DPH.

In this configuration, it is assumed that, for example, the high side transistors Qh1 and Qh2 and the low side transistors Q11 and Q12 are mounted over the wiring substrate (printed substrate) as discrete components. In this case, in fact, the high potential side power source node VCC and the drains of the high side transistors Qh1 and Qh2 are coupled by power source supply lines LNs1 and LNs2 mainly including the wiring over the wiring substrate. The corresponding power source supply lines LNs1 and LNs2 respectively have parasitic inductances Lp1 and Lp2.

Then, for example, when the high side transistor Qh1 is transited from. ON to OFF (that is, when it is switched from the driving path DPH to the recirculation path RPH), a surge voltage ΔV shown in Equation (1) may be generated at the drain of the high side transistor Qh1 using the high potential side power source node VCC as a reference, by the parasitic inductance Lp1. In Equation (1), ΔI represents a driving current value, and Δt represents a switching time.

$$\Delta V = Lp1 * \Delta I / \Delta t \tag{1}$$

In the switching circuit SWC of FIG. 10, to absorb the surge voltage ΔV, the drain of the high side transistor Qh1 and the source of the low side transistor Q11 are coupled through a snubber circuit (a capacitor Cs1). Similarly, the drain of the high side transistor Qh2 and the source of the low side transistor Q12 are coupled through a snubber circuit (a capacitor Cs2).

However, in fact, a certain amount of distance may be required in a region between, for example, the drain of the high side transistor Qh1 and the source of the low side transistor Q11. Thus, parasitic inductances Lp3 and Lp4 exist at this leading wiring. As a result, a charging/discharging current to the capacitor Cs1 is inhibited by the parasitic inductances Lp3 and Lp4 of the leading wiring, thus resulting in the insufficient surge reduction effect.

This problem is remarkable, particularly, when the high side transistor Qh1 is replaced from, for example, an IGBT to a high-speed transistor, such as a GaN transistor or SiC transistor. For example, when the switching time in the IGBT is 40 ns, the switching time is 4 ns (at a speed of ten times) when the high-speed transistor is used, and the surge voltage ΔV is ten times as large. To absorb the surge voltage ΔV by the capacitor Cs1, the capacitor Cs1 needs to be charged with a current of ten times as large in a short period of time, that is 4 ns. It is, however, difficult to realize this operation, because a steep current change is inhibited by the parasitic inductances Lp3 and Lp4.

<Scheme of Switching Device (Embodiment 1)>

Figure 1:
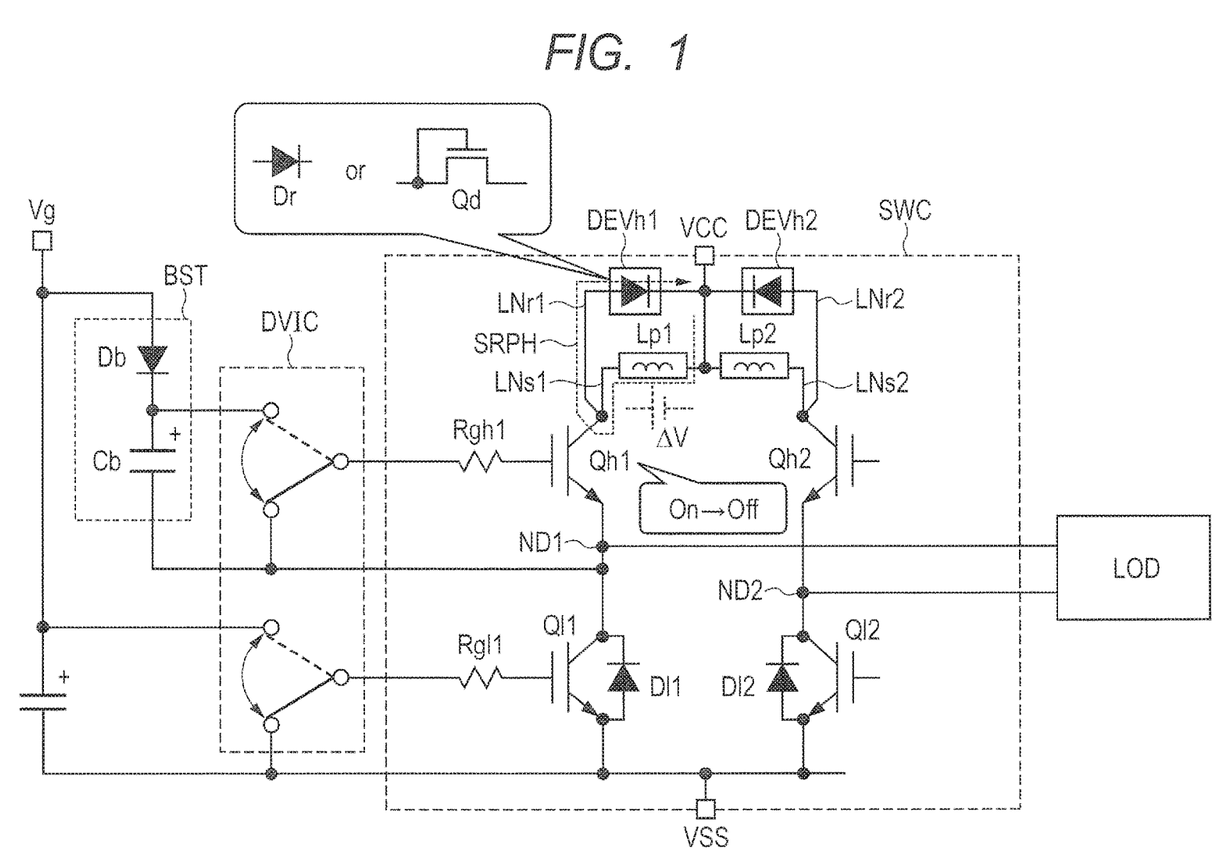
FIG. 1 is a schematic diagram illustrating a configuration example and an operational example of the main part of a switching device according to an embodiment 1 of the present invention.

FIG. 1 is a schematic diagram illustrating a configuration example and an operational example of the main part of the switching device according to the embodiment 1 of the present invention. As compared with the configuration example of FIG. 10, the switching device illustrated, in FIG. 1 includes surge recirculation lines LNr1 and LNr2 and surge recirculation devices DEVh1 and DEVh2 in the switching circuit SWC, in place of the leading wirings of the capacitors Cs1 and Cs2. The surge recirculation devices DEVh1 and DEVh2 cause a current to flow in one direction, and are transistors Qd, for example, diodes Dr or diode-coupled (short circuit between the drain and the gate) transistors.

The surge recirculation line LNr1 couples the drain of the high side transistor (the switching transistor) Qh1 to the high, potential side power source node VCC through the surge recirculation device DEVh1, to cause recirculation of the surge voltage ΔV generated at the drain of the high side transistor Qh1 toward the high potential side power source node VCC, as illustrated in FIG. 10. Similarly, the surge recirculation line LNr2 couples the drain of the high side transistor (the switching transistor) Qh2 to the high potential side power source node VCC through the surge recirculation device DEVh2, to cause recirculation of the surge voltage ΔV generated at the drain of the high side transistor Qh2 toward the high potential side power source node VCC.

According to this configuration, as illustrated in FIG. 1, a surge recirculation path SRPH is formed. Along this path, the surge voltage ΔV generated, for example, at the parasitic inductance Lp1 of the power source supply line LNs1 recirculates toward the high potential side power source node VCC through the surge recirculation line LNr1. At this time, a diode Dr to serve as the surge recirculation device DEVh1 is forward biased, because the drain of the nigh side transistor Qh1 is coupled to the anode, and the high potential side power source node VCC is coupled to the cathode.

This diode Dr is reverse biased in a period of the driving path DPH illustrated in FIG. 10. Thus, the surge recirculation line LNr1 does not function as a power source supply line. The surge recirculation devices DEVh1 and DEVh2 preferably cause the surge voltage ΔV to recirculate to the high potential side power source node VCC at a high speed. Tough not limited, they are formed of a SiC Schottky diode, a diode-coupled SiC transistor or a GaN transistor.

Figure 2:
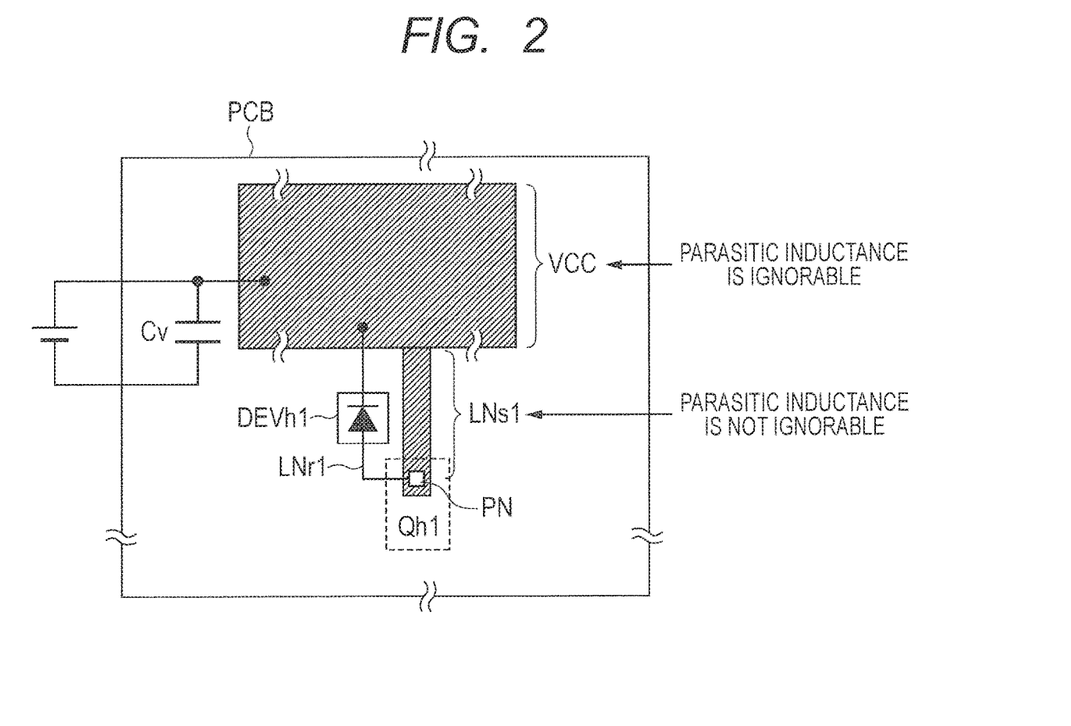
FIG. 2 is a conceptual diagram illustrating a schematic layout configuration example of the surrounding of a surge recirculation line in FIG. 1.

FIG. 2 is a schematic diagram illustrating a schematic layout configuration example of the surrounding of a surge recirculation line in FIG. 1. In FIG. 2, the high potential side power source node VCC is provided, for example, over a wiring substrate PCB, and the power source supply line LNs1 is led around toward the external terminal (the drain terminal) PN of the high side transistor Qh1 from, the high potential side power source node VCC. In this case, the high potential side power source node VCC implies a position in which the parasitic inductance is substantially ignorable.

Specifically, for example, when the capacitor Cv holding the VCC level is mounted over the wiring substrate PCB, the high potential side power source node VCC is, basically, one end of the capacitor Cv. If one end of the capacitor Cv is coupled to the wide wiring pattern in which the parasitic inductance is ignorable, as illustrated in FIG. 2, the high potential side power source node VCC includes this wiring pattern.

The power source supply line LNs1 implies a wiring in which the parasitic inductance is not substantially ignorable. The surge recirculation line LNr1 couples an external terminal PN of the high side transistor Qh1 to this high potential side power source node VCC, through the surge recirculation device DEVh1. The surge recirculation device DEVh1 is mounted over the wiring substrate PCB, for example, as a discrete component.

<Main Effect of Embodiment 1>

Accordingly, representatively, it is possible to realize a reduction in the surge, by using the switching device of the embodiment 1. This effect is remarkable, particularly, when the high side transistors Qh1 and Qh2 are high-speed transistors, such as a GaN transistor or a SiC transistor. Specifically, in the configuration example of FIG. 10, the drain of the high side transistor Qh1 needs to be led to the source of the low side transistor Q11. However, in the configuration example of FIG. 1, the drain of the high side transistor Qh1 may simply be led to the high potential side power source node VCC. Thus, in the configuration example of FIG. 1, it is possible that the leading wiring (that is, the surge recirculation line LNr1) has a shorter-wiring length than that in the configuration example of FIG. 10. As a result, the parasitic inductance of the surge recirculation line LNr1 can be lowered, and it is possible to reduce the effect of the inhibition by the parasitic inductance, when the surge voltage ΔV recirculates toward the high potential side power source node VCC.

EMBODIMENT 2

<Scheme of Switching Device (Embodiment 2)>

Figure 3A:
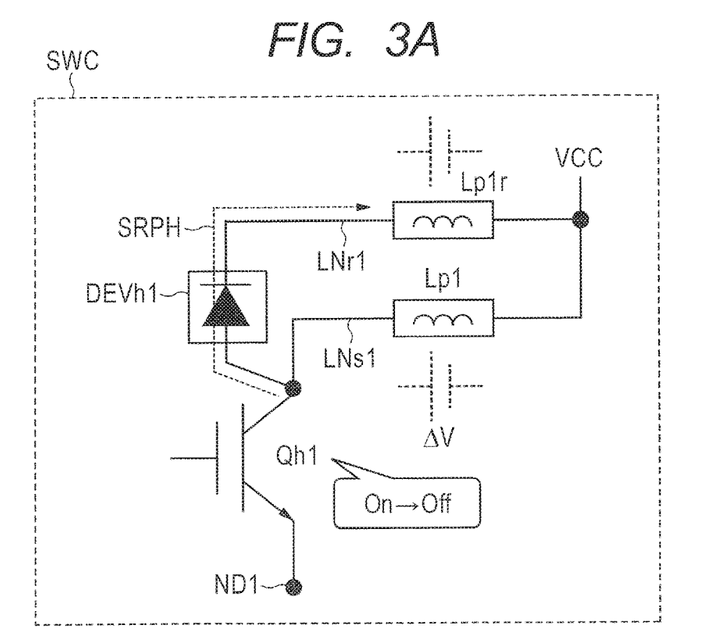
FIG. 3A is an explanatory diagram illustrating the assumed problem, in a switching device according to an embodiment 2 of the present invention.
Figure 3B:
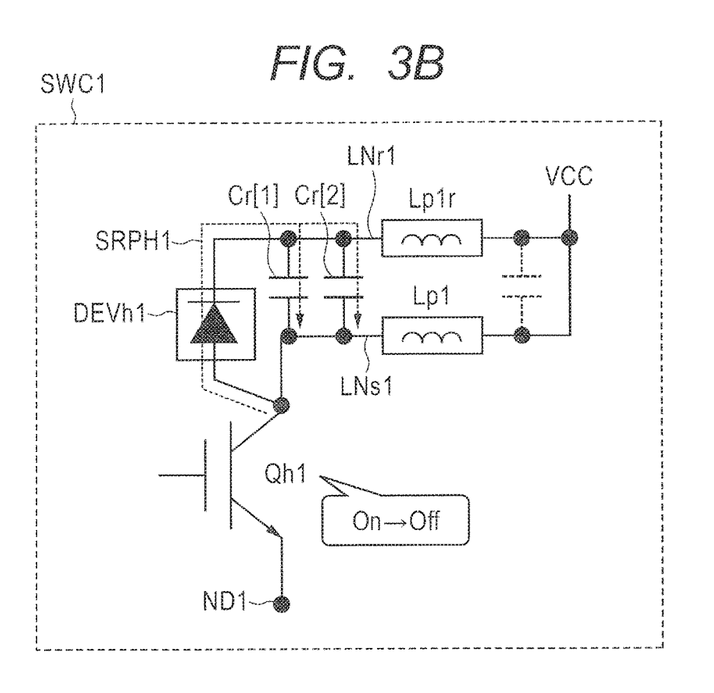
FIG. 3B is a schematic diagram illustrating one part of a configuration example and an operational example in the switching device according to the embodiment 2 of the present invention.

FIG. 3A is an explanatory diagram illustrating the assumed problem in a switching device according to the embodiment 2 of the present invention. FIG. 3B is a schematic diagram illustrating one part of a configuration example and an operational example in the switching device according to the embodiment 2 of the present invention. FIG. 3A illustrates the extracted configuration around the high side transistor Qh1 in the switching circuit SWC illustrated in FIG. 1. As illustrated in the embodiment 1, if the switching circuit SWC of FIG. 3A is used, the wiring length of the surge recirculation line LNr1 can be shortened, thus enabling to realize a reduction in the surge, as compared with the configuration example of FIG. 10.

More specifically, a parasitic inductance Lp1r exists also in the surge recirculation line LNr1. Thus, when the surge voltage ΔV recirculates through the surge recirculation line LNr1, there is a possibility of inhibition by the parasitic inductance Lp1r, though it is still a lower possibility than that of the configuration example of FIG. 10. That is, the parasitic inductance Lp1r generates a counter electromotive voltage that causes inhibition of the flow of the current toward the high potential side power source node VCC in the surge recirculation line LNr1.

As illustrated in FIG. 3B, the switching circuit SWC1 in the switching device of the embodiment 2 has a single or a plurality of (in this example, a plurality of) capacitors Cr[1], Cr [2], . . . , for coupling the power source supply line LNs1 with a section between the surge recirculation device DEVh1 in the surge recirculation line LNr1 and the high potential side power source node VCC. The surge recirculation line LNr1 is arranged parallelly adjacent to, for example, the power source supply line LNs1, over the wiring substrate PCB illustrated in FIG. 2. Though not illustrated, the configuration around the high side transistor Qh2 is the same as that of FIG. 3B.

<Main Effect of Embodiment 2>

Accordingly, by using the switching device of the embodiment 2, it is possible to realize a further reduction of the surge, as compared with the case of the embodiment 1. More specifically, as illustrated in FIG. 3B, it is possible to configure a surge recirculation path SRPH1, along the bypass path including the capacitors Cr[1], Cr [2], . . . , and without reaching the high potential side power source node VCC. In the surge recirculation path SRPH1, a large current corresponding to the surge voltage ΔV can flow at a high speed. In the process, the surge is absorbed by the capacitors Cr[1 ], Cr[2], . . . , and converted to heat by the surge recirculation device DEVh1. As a result, even when the parasitic inductance Lp1r exists, it is possible to reduce the surge.

Further, the surge recirculation line LNr1 and the power source supply line LNs1 are arranged parallelly and adjacent to each other. As a result, magnetic fields in accordance with currents are cancelled with each other, and it is possible to reduce the effective two parasitic inductances Lp1 and Lp1r. If the effective parasitic inductance Lp1 is reduced, the surge voltage ΔV to be generated is reduced as well.

EMBODIMENT 3

<Scheme of Switching Device (Embodiment 3)>

Figure 4A:
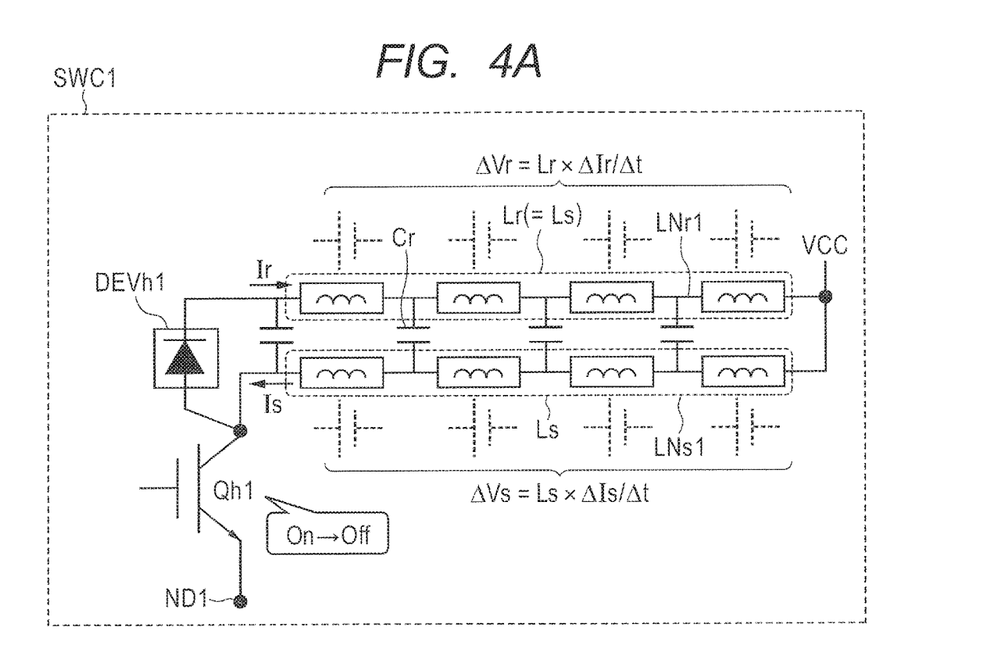
FIG. 4A is an explanatory diagram illustrating the assumed problem, in a switching device according to an embodiment 3 of the present invention.
Figure 4B:
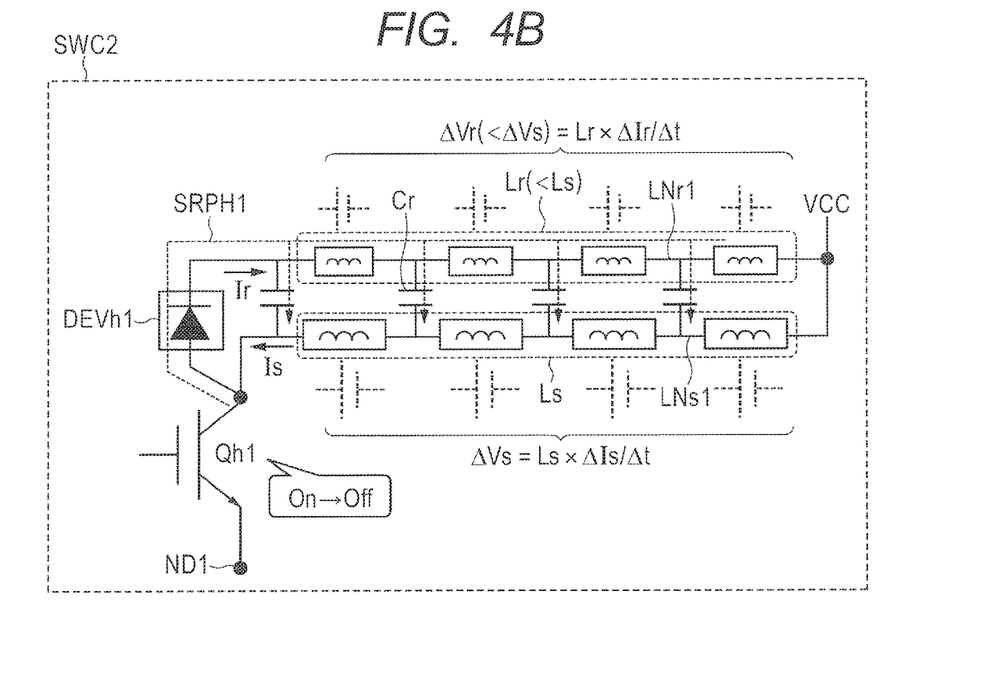
FIG. 4B is a schematic diagram illustrating one part of a configuration example and an operational example in the switching device according to the embodiment 3 of the present invention.

FIG. 4A is an explanatory diagram illustrating the assumed problem in a switching device according to an embodiment 3 of the present invention. FIG. 4B is a schematic diagram illustrating one part of a configuration example and an operational example, in the switching device according to the embodiment 3 of the present invention. FIG. 4A illustrates an equivalent circuit, when a parasitic inductance Ls of the power source supply line LNs1 and a parasitic inductance Lr of the surge recirculation line LNr1 are equal to each other, in the switching circuit SWC1 illustrated in FIG. 3B.

Now, consideration is given to a situation in which the surge recirculation path is formed, in accordance with the transition from ON to OFF of the high side transistor Qh1. When the current flowing through the power source supply line LNs1 is represented as "Is", and the reduction rate of the current "Is" is represented as "ΔIs/Δt", a surge voltage (a counter electromotive voltage) ΔVs of Equation (2) is generated in the power source supply line LNs1. The current flowing through the surge recirculation line LNr1 is represented as "Ir", and the increase rate of the current "Ir" is represented as "ΔIr/Δt", a counter electromotive voltage ΔVr of Equation (3) is generated in the surge recirculation line LNr1.

$$\Delta Vs = Ls \ast \Delta Is/\Delta t \quad (2)$$

$$\Delta Vr = Lr \ast \Delta Ir/\Delta t \quad (3)$$

When the parasitic inductance Ls and the parasitic inductance Lr are equal to each other, and the current "Is" and the current "Ir" are equal to each other, the counter electromotive voltage ΔVs of Equation (2) and the counter electromotive voltage ΔVr of Equation (3) are equal to each other. In this case, no potential difference is generated between the power source supply line LNs1 and the surge recirculation line LNr1, and there is a possibility that the surge recirculation path itself is not sufficiently configured (that is, the surge recirculation device DEVh1 is not forward biased, and the current "Is" cannot flow as the current "Ir" as is).

As illustrated in FIG. 4B, a switching circuit SWC2 of the switching device according to the embodiment 3 is configured that the parasitic inductance Lr of the surge recirculation line LNr1 is lower than the parasitic inductance Ls of the power source supply line LNs1. Specifically, for example, in the wiring substrate PCB of FIG. 2, the cross sectional area of the surge recirculation line LNr1 is configured to be larger than the cross sectional area of the power source supply line LNs1. A method of changing the wiring width and a method of changing the number of wirings with the same wiring width are examples of the method for changing the cross sectional area with a precondition that the wirings have an equal thickness. Though not illustrated, the configuration around the high side transistor Qh2 is the same as that of FIG. 4B.

Figure 5:
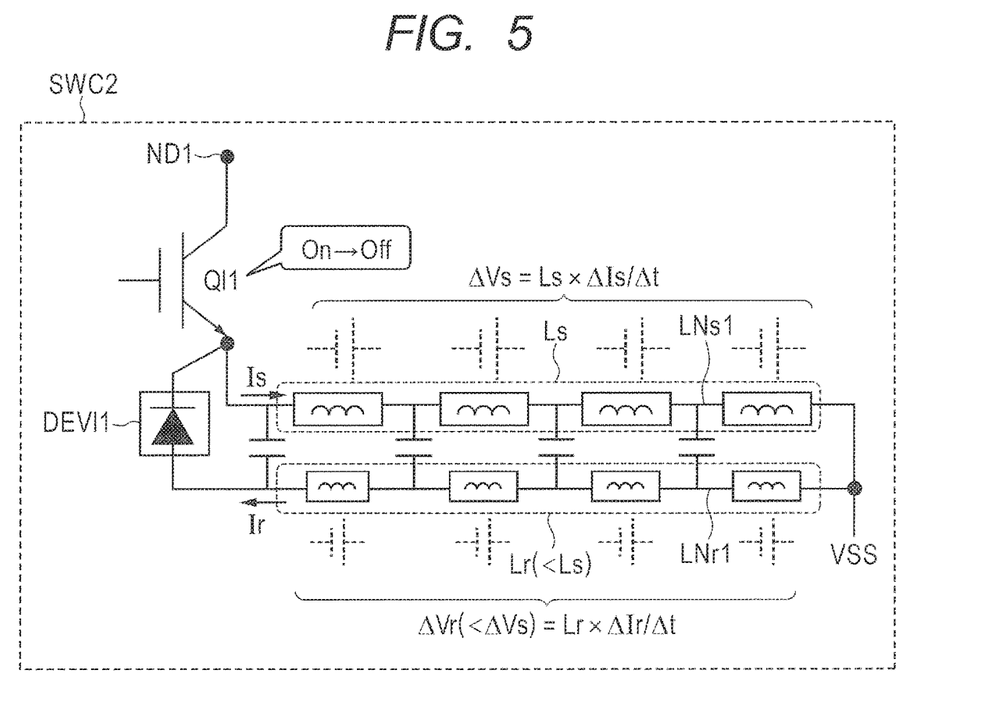
FIG. 5 is a schematic diagram illustrating one part of a configuration example and an operational example in the switching device according to the embodiment 3 of the present invention.

FIG. 5 is a schematic diagram illustrating one part of the configuration example and the operational example, in the switching device according to the embodiment 3 of the present invention. As illustrated in FIG. 5, the configuration of FIG. 4B is not limited to the high side transistor Qh1, and is applicable to the low side transistor Q11. For example, by reference to FIG. 10, in the switching device (e.g., three-phase inverter) , the switching of the low side transistor Q11 may be controlled in accordance with a PWM signal, in a state where the high side transistor Qh2 is driven ON. In this case, the recirculation path RPH is constructed in the high side path (a path through the recirculation diode (not illustrated in FIG. 10) of the high side transistor).

In FIG. 5, if the low side transistor Q11 is transited from ON to OFF, a counter electromotive voltage causing the current "Is" to keep flowing is generated by the parasitic inductance Ls. As a result, a surge voltage is generated at the source of the low side transistor Q11. In the configuration example of FIG. 5, this surge recirculates toward the low potential side power source node VSS through the surge recirculation line LNr1 including the surge recirculation device DEV11. In the surge recirculation device DEV11 (for example, a diode), the cathode is coupled to the source of the low side transistor Q11, while the anode is coupled to the low potential side power source node VSS. Note that the surge recirculation path may be provided on the low side, as well in the cases of the embodiments 1 and 2.

<Main Effect of Embodiment 3>

As described above, with using the switching device of the embodiment 3, it is possible to securely attain the reduction effect of the surge, as described in the embodiment 2. Specifically, the counter electromotive voltage ΔVr can be lower than the counter electromotive voltage ΔVs. Thus, the surge recirculation device DEVh1 is forward biased, and it is possible to securely form the surge recirculation path SRPH1 through a single or a plurality of capacitors Cr. Note that the descriptions have been made for the configuration of FIG. 3B. However, it is possible to securely keep the surge recirculation device DEVh1 forward biased at the time of surge recirculation, even in the configuration of FIG. 1 without the capacitor Cr, by fixing the relationship of the parasitic inductances in the same manner.

EMBODIMENT 4

Configuration of Switching Device (Embodiment 4)>

Figure 6:
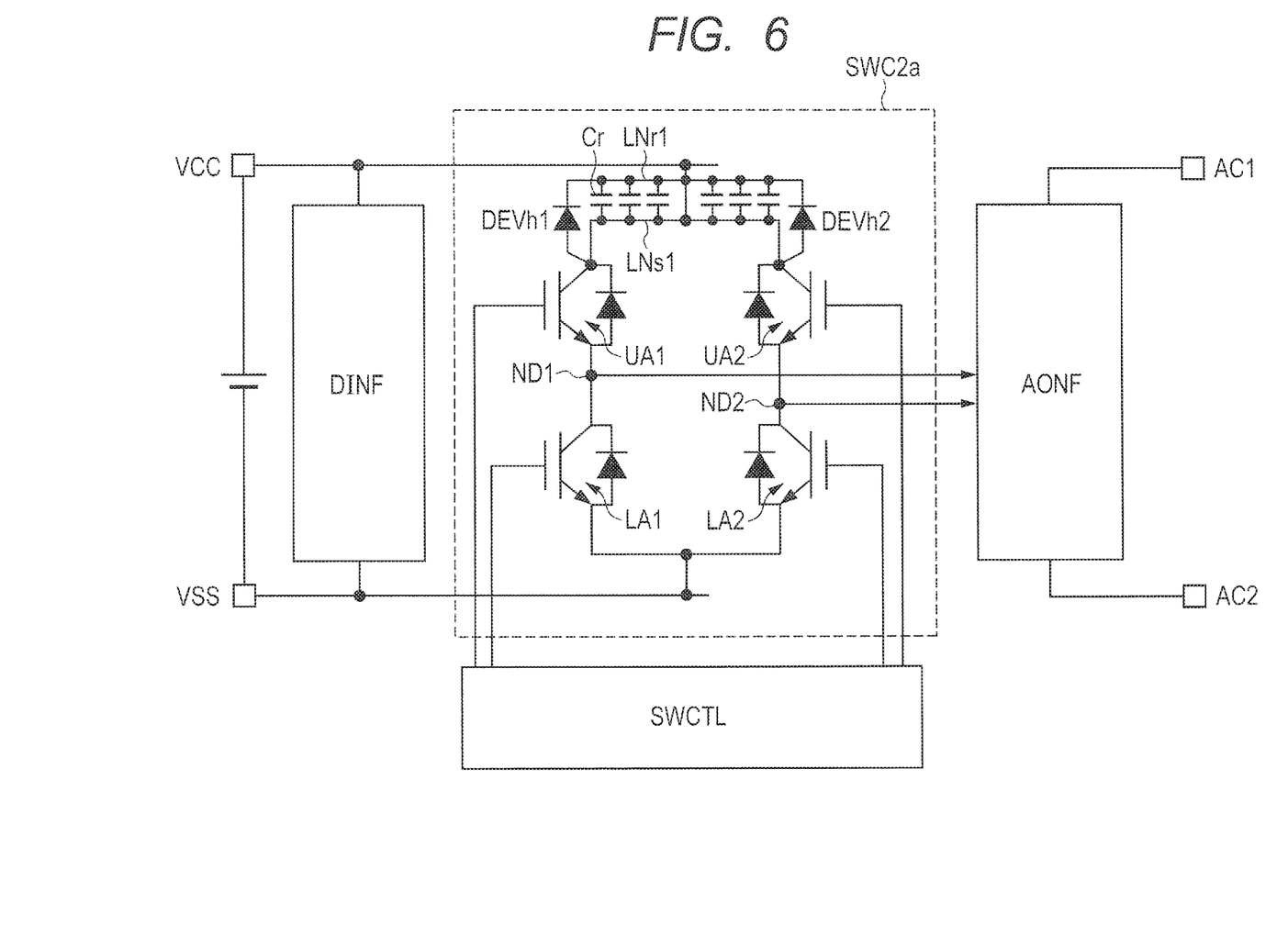
FIG. 6 is a schematic diagram illustrating a configuration example of the main part of a switching device according to an embodiment 4 of the present invention.

FIG. 6 is a schematic diagram illustrating a configuration example of the main part of a switching device according to an embodiment 4 of the present invention. FIG. 6 illustrates a configuration example of a DC/AC inverter which is one switching regulator, as an example of the switching device. In FIG. 6, a switching circuit SWC2a is configured in a manner that the configuration example of FIG. 4B is applied to the same H bridge circuit as the switching circuit SWC of FIG. 1.

In this example, the H bridge circuit is configured with a pair of high side arm UA1 and a low side arm LA1 coupled to the intermediate node ND1 and a pair of nigh side arm UA2 and a low side arm LA2 coupled to the intermediate node ND2, Each of the arms (UA1, UA2, LA1, LA2) is configured with a parallel coupling circuit of the transistor and the recirculation diode (recirculation device).

A DC input noise filter DINF is coupled between the high potential side power source node VCC and the low potential side power source node VSS, and supplies a DC input voltage between the nodes to the switching circuit SWC2a, after removing the noise therefrom. A switching control circuit SWCTL generates an AC output voltage between the intermediate nodes ND1 and ND2 of the switching circuit SWC2a, thus controlling the switching of each of the arms (each of the transistors) in accordance with a PWM signal. An AC output noise filter AONF receives an AC output voltage generated between the intermediate nodes ND1 and ND2, and outputs it to AC output nodes AC1 and AC2, after removing the noise therefrom.

<Details of Switching Circuit>

Figure 7A:
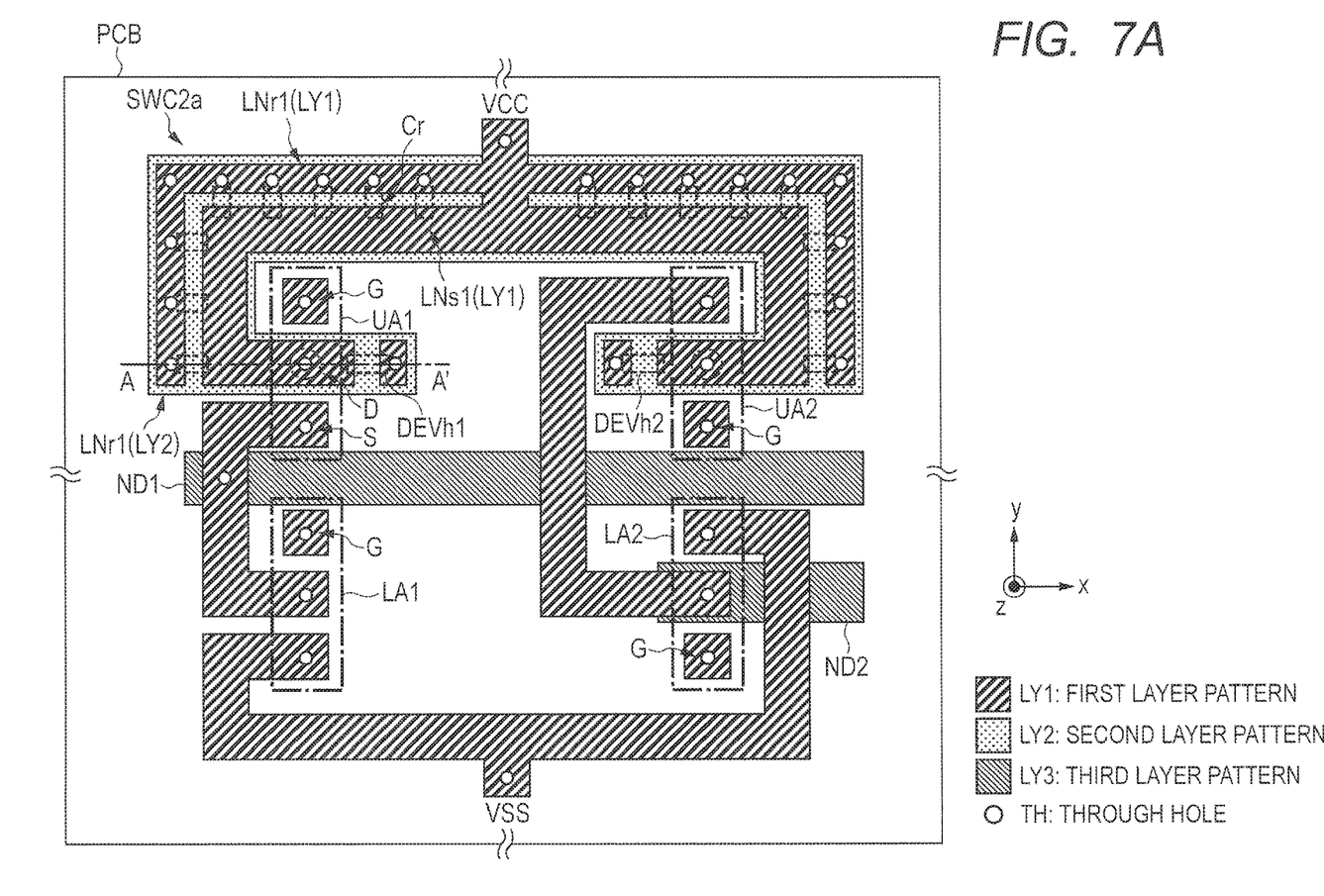
FIG. 7A is a plan view illustrating a schematic mounting configuration example of a switching circuit in FIG. 6.

FIG. 7A is a plan view showing a schematic mounting configuration example of a switching circuit in FIG. 6. The switching circuit SWC2a of FIG. 7. A is configured using, for example, the wiring substrate PCB including a plurality of wiring layers including representatively the printed wiring substrate. In this example, the wiring substrate PCB includes three wiring layers, that is, a wiring layer LY1 as the first layer, a wiring layer LY2 as the second layer, and a wiring layer LY3 as the third layer, sequentially from the uppermost layer. The wiring substrate PCB includes the high potential side power source node VCC, the low potential side power source node VSS, and the intermediate nodes ND1 and ND2.

The high side arms UA1 and UA2 are mounted over the wiring substrate PCB, in a manner that they are coupled between the high potential side power source node VCC and the intermediate nodes ND1 and ND2. The low side arms LA1 and LA2 are mounted over the wiring substrate PCB, in a manner that they are coupled between the low potential side power source node VSS and the intermediate nodes ND1 and ND2. In this example, each of the high side arms UA1 and UA2 and the low side arms LA1 and LA2 is configured with a discrete component. The discrete component has the transistor and the recirculation device illustrated in FIG. 6 mounted as one package.

Each of the nodes (VCC, VSS, ND1, and ND2) and the arms (UA1, UA2, LA1, and LA2) is appropriately coupled with a wiring pattern of each of the wiring layers formed in the wiring substrate PCB. Focusing on the example of the surrounding of the high side arm UA1, the power source supply line LNs1 (LY1) is a wiring pattern of the wiring layer LY1, and couples the high potential side power source node VCC with a drain terminal D of the high side arm UA1 including the transistor. The surge recirculation device DEVh1 is mounted over the wiring substrate PCB, and its one end (anode) is coupled to the drain terminal D, while the other end (cathode) is coupled to the surge recirculation line LNr1 (LY2) as a wiring pattern of the wiring layer LY2, through the wiring pattern (a land pattern) of the wiring layer LY1 with a through hole TH provided therein.

The surge recirculation line LNr1 (LY2) includes a wiring width wider than the power source supply line LNs1 (LY1), and is arranged in parallel to the power source supply line LNs1 (LY1) in a form (that is, in a z-axis direction) across the wiring layer. In other words, when the wiring substrate PCB is transparently seen in plan view as illustrated in FIG. 7A, and when the formation region of the surge recirculation line LNr1 (LY2) in the wiring layer LY2 is assumed as "ARA", the power source supply line LNs1 (LY1) is arranged in a form overlapping a partial region of "ARA".

Further, in this case, the surge recirculation line LNr1 (LY1) is formed even in the wiring pattern of the wiring layer LY1, in addition to the surge recirculation line LNr1 (LY2). When the wiring substrate PCB is transparently seen in plan view, this surge recirculation line LNr1 (LY1) is arranged in a form overlapping the region excluding the power source supply line LNs1 (LY1) in "ARA", and arranged in parallel to the same wiring layer LY1 (the xy plan) as the power source supply line LNs1 (LY1). One end of the surge recirculation line LNr1 (LY1) is coupled to the high potential side power source node VCC, like the power source supply line LNs1 (LY1). The surge recirculation line LNr1 (LY1) and the surge recirculation line LNr1 (LY2) are appropriately coupled to each other through a plurality of through holes TH.

According to this configuration, the surge recirculation lines LNr1 (LY1) and LNr1 (LY2) couple the drain terminal D of the high side arm UA1 to the high potential side power source node VCC through the surge recirculation device DEVh1, and causes the surge generated at the drain terminal D to recirculate toward the high potential side power source node VCC. Specifically, the surge generated at the drain terminal D recirculates along a path of DEVh1→LNr1 (LY2)→"LNr1 (LY2)+LNr1 (LY1)".

On the wiring substrate PCB, the capacitors Cr are mounted between the surge recirculation line LNr1 (LY1) and the power source supply line LNs1 (LY1). It is possible to configure the surge recirculation path SRPH1 with the capacitors Cr, as illustrated in FIG. 3B. As illustrated in FIG. 7A, the entire wiring width (that is, the cross sectional area) of the surge recirculation line LNr1 (LY1) and LNr1 (LY2) is larger than the cross sectional area of the power source supply line LNs1 (LY1). As a result, as described in FIG. 4B, it is possible to securely configure the surge recirculation path SRPH1.

Figure 7B:
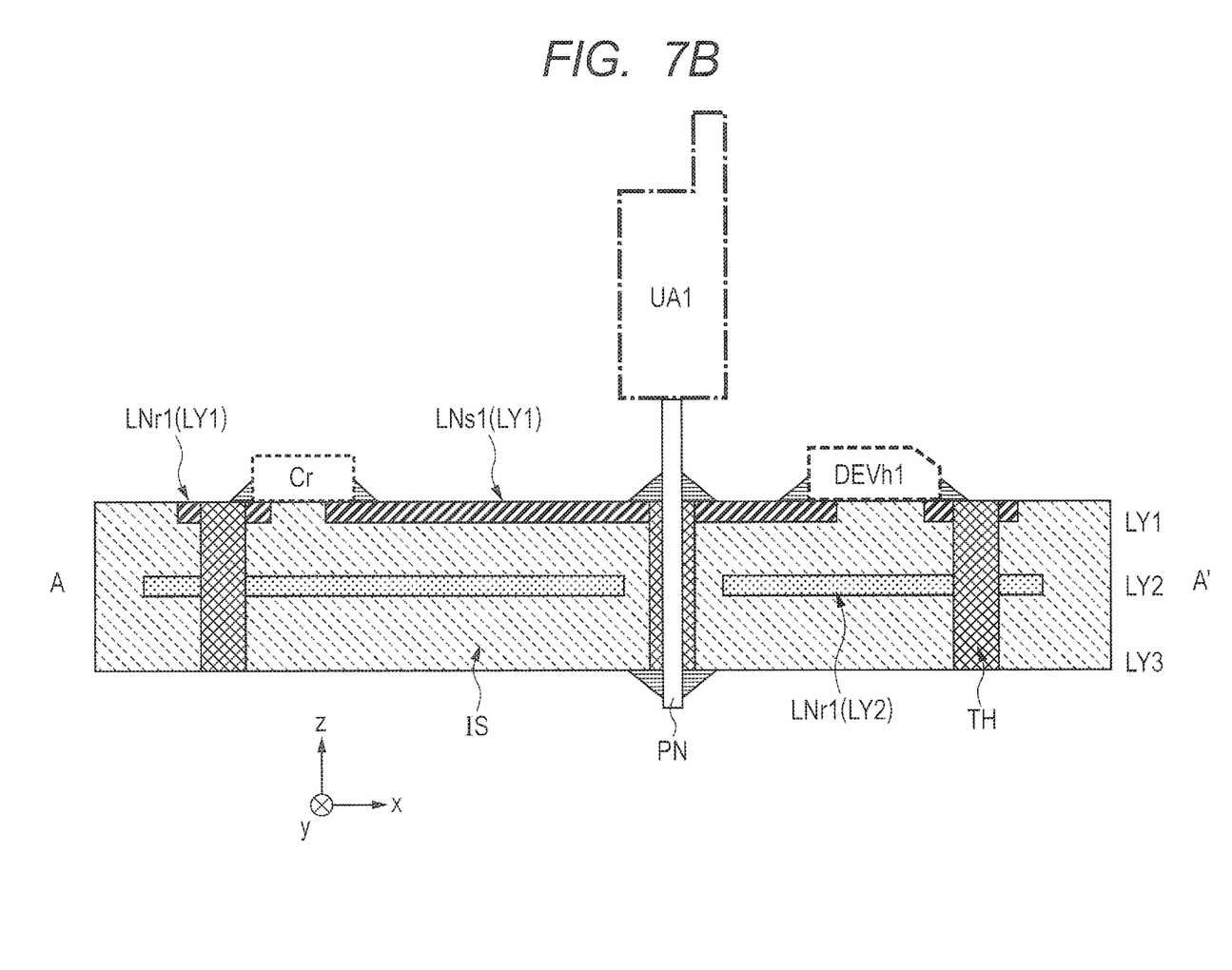
FIG. 7B is a cross sectional view shewing a configuration example along A-A' in FIG. 7A.

FIG. 7B is a cross sectional view illustrating a configuration example between A-A' in FIG. 7A. As illustrated in FIG. 7B, the wiring layer LY1 and the wiring layer LY2 are adjacent wiring layers between which an insulating layer IS is formed. As a result, the power source supply line LNs1 (LY1) and the surge recirculation line LNr1 (LY2) can be arranged adjacent to each other, and the capacity of the insulating layer IS between the power source supply line LNs1 (LY1) and the surge recirculation line LNr1 (LY2) can function as the same as the capacitors Cr. An external terminal (in this case, the drain terminal) PN of the high side arm UA1 is not coupled to the surge recirculation line LNr1

(LY2), to configure the surge recirculation path through the surge recirculation device DEVh1.

In FIG. 7A and FIG. 7B, the descriptions have been made to the surrounding of the high side arm UA1. The same applies to the mounting configuration of the high side arms UA2. Note, however, that, in the example of FIG. 7A, the high side arm UA2 is mounted in a direction opposite to that of the high side arm UA1, and a gate terminal G and a source terminal S are replaced with each other. The drain terminal of the low side arm LA1 is coupled to the source terminal S of the high side arm UA1 using a wiring pattern of the wiring layer LY1. This wiring pattern is coupled to a wiring pattern of the wiring layer LY3 through the through hole TH. These wiring patterns correspond to the intermediate node ND1. The same applies to the low side arm LA2 and the high side arm UA2.

Figure 8:
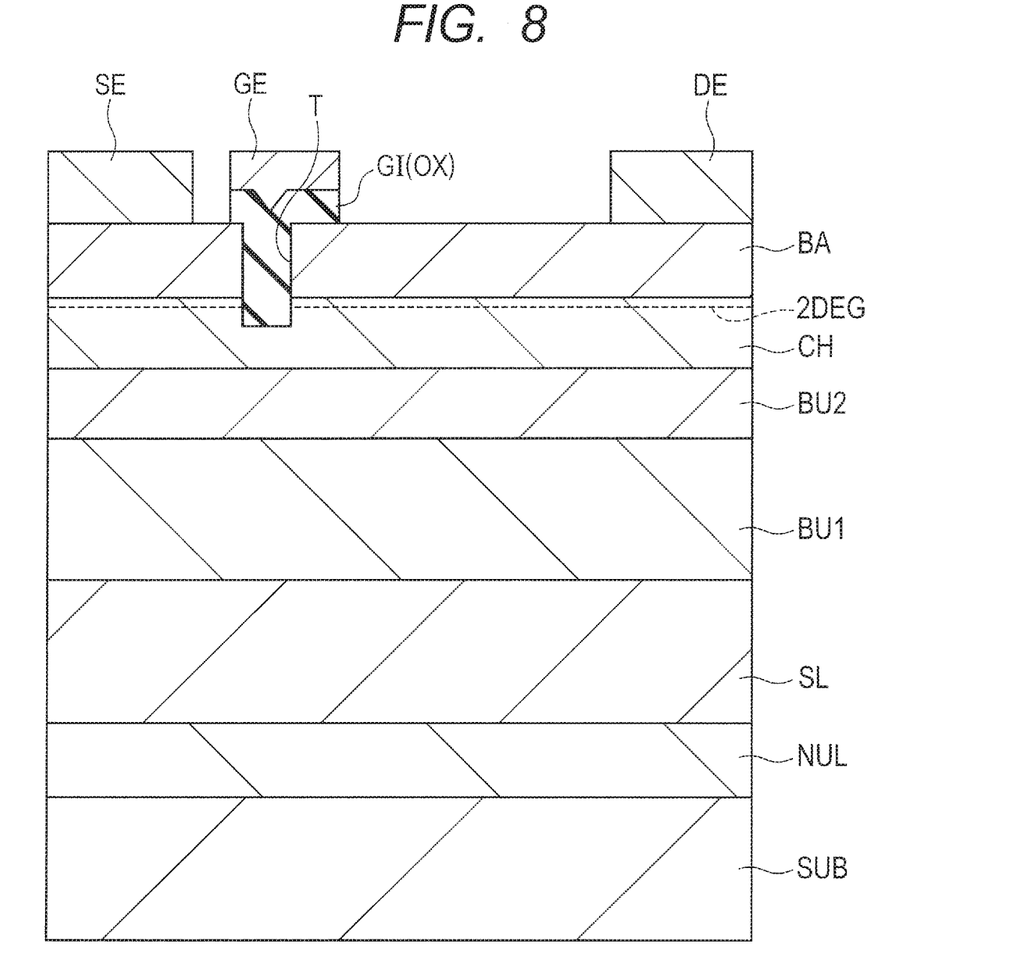
FIG. 8 is a cross sectional view showing a configuration example of a transistor of each arm in the switching circuit of FIG. 6.

FIG. 8 is a cross sectional view showing a configuration example of a transistor of each arm, in the switching circuit of FIG. 6. FIG. 8 illustrates a configuration example of a GaN transistor which is of a HEMT (High Electron Mobility Transistor) type. The GaN transistor includes a nucleation layer NUL, a superlattice layer SL, a buffer layer BU1, a buffer layer BU2, a channel layer (also called an electron transient layer) CH, and a barrier layer BA, which are formed over the semiconductor substrate SUB.

The nucleation layer NUL is an aluminum nitride layer (AlN), and is provided for growing the superlattice layer SL. The superlattice layer SL is a laminated film (an AlN/GaN film) of, for example, a gallium nitride (GaN) layer and the aluminum nitride (AlN) film, and is provided for improving the crystallinity of the upper layers or relaxing a film stress. The buffer layer BU1 is, for example, a GaN layer. The buffer layer BU2 has the electron affinity lower than that of the buffer layer BU1, and is, for example, an AlGaN layer. The channel layer CH has the electron affinity greater than that of the buffer layer BU2, and is, for example, a GaN layer. The barrier layer BA has the electron affinity lower than that of the channel layer CH, and is, for example, an AlGaN layer.

The GaN transistor has a gate electrode GE formed through a gate insulating film GI, a source electrode SE and a drain electrode DE which are arranged on both sides of the gate electrode GE, above the channel layer CH. The gate electrode GE penetrates through the barrier layer BA, and is formed inside a trench (also called a recess) T reaching the middle of the channel layer CH, through the gate insulating film GI. The source electrode SE is arranged over one part of the barrier layer BA after separated by the trench T, while the drain electrode DE is arranged over the other part of the barrier layer BA. The gate insulating film GI is, for example, an aluminum oxide ($Al_2O_3$) film. The gate electrode GE is, for example, a titanium nitride (TiN) film. The source electrode SE and the drain electrode DE are a laminated film of, for example, a TiN film and an Al film.

In this configuration, the GaN transistor is in an ON state, by applying a sufficient positive voltage on the gate bias. At this time, in the channel layer CH, electrons accumulated right below the gate electrode GE function as carriers, and a current flows. A high electron mobility secondary electron gas 2 DEG, which is generated in an interface between the barrier layer BA and the channel layer CH, functions as a carrier, and a current flows, between the gate electrode GE, the source electrode SE, and the drain electrode DE. The GaN transistor is in an OFF state, when the secondary electron gas 2 DEG is depleted, by applying a voltage lower than a threshold value on the gate bias, for example, the same voltage as that for the source or a sufficient negative voltage.

<Main Effect of Embodiment 4>

Accordingly, it is possible to attain sufficient layout of the wiring substrate PCB, for realizing a reduction effect of the surge, as described in the embodiment 3, by using the switching device of the embodiment 4. Specifically, in FIG. 7A, for example, when a surge recirculation line is formed only in the wiring layer LY1 as the first layer, as described above, the surge recirculation line is formed preferably wider. This causes great occupation in the area of the wiring substrate PCB.

In the example of FIG. 7A, the surge recirculation line LNr1 (LY2) is formed in the wiring layer LY2 as the second layer. Using a blank region which is generated in the first wiring layer LY1 at this time, the surge recirculation line LNr1 (LY1) is formed. As a result, the surge recirculation line can be formed without greatly occupying the area of the wiring substrate PCB, and it is possible to sufficiently arrange the capacitor Cr.

From another point of view, it is possible to improve the degree of freedom at the time of performing the wiring design of the wiring substrate PCB. This effect can be attained like the cases of the embodiments 2 and 3. Specifically, when performing the wiring design, normally, it is required to sufficiently shorten the length of the power source supply line LNs1, to reduce the surge. However, in fact, the length may not sufficiently be shortened based on various restrictions. In the method of each embodiment, it is possible to relax the request of the length of the power source supply line LNs1 and to flexibly perform the wiring design, because the surge can be reduced by providing the surge recirculation line LNr1 in accordance with the enlarged power source supply line LNs1.

EMBODIMENT 5

Configuration of Switching Device (Embodiment 5)>

Figure 9:
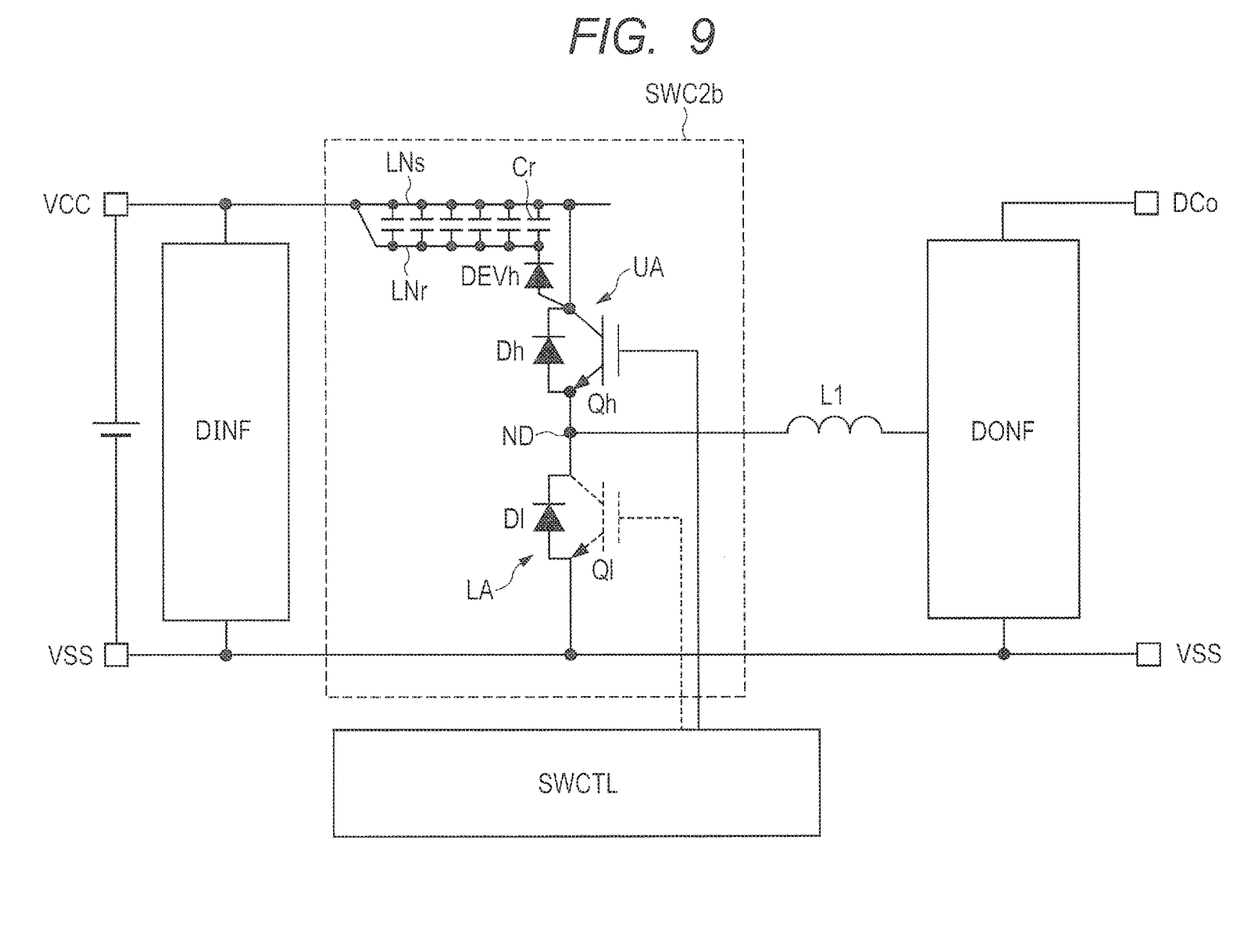
FIG. 9 is a schematic diagram, illustrating a configuration example of the main part of a switching device according to an embodiment 5 of the present invention.

FIG. 9 is a schematic diagram illustrating a configuration example of the main part of a switching device according to an embodiment 5 of the present invention. FIG. 9 illustrates a configuration example of a DC/DC converter which is one switching regulator, as one example of the switching device. In FIG. 9, the switching circuit SWC2b is formed in a manner that the configuration example of FIG. 4B is applied to a half-bridge circuit.

The half bridge circuit is configured with a pair of the high side arm UA and the low side arm LA coupled to the intermediate node ND. The high side arm UA. is configured with, the high side transistor Qh. and the recirculation diode Dh, while the low side arm LA is configured with the recirculation diode D1 or the low side transistor Q1 and the recirculation diode (recirculation device) D1.

The DC input noise filter DINF is coupled between the high potential side power source node VCC and the low potential side power source node VSS, and supplies the DC input voltage between the nodes to the switching circuit SWC2b, after removing the noise therefrom. The switching control circuit SWCTL controls the high side transistor Qh in accordance with a PWM signal, thereby controlling accumulation of electric power from the intermediate node ND to the inductor L1 and controlling a recirculation operation using the inductor L1 as electromotive force. At the time of this recirculation operation, the switching control circuit SWCTL controls switching of the low side transistor Q1, thereby performing synchronous rectification. The DC output noise filter DONE receives an output voltage from the inductor L1, and outputs it to the DC output node Dco1, after removing the noise therefrom.

Descriptions will now be made to an example using specific numerical values. The parasitic inductance of the high side power source supply line LNs is set at 40 [nH], the switching time of the normal transistor (e.g. IGBT) is set at 40 [ns], and the current flowing through the transistor is set at 20 [A]. In this case, by Equation (1), the surge voltage $\Delta V$ of the normal transistor is 20 [V] (=40[nH]*20[A]/40 [ns]). When the switching time is $^1/_{10}$ (that is, 4[ns]) with the application of a high-speed transistor, such as a GaN transistor, the surge voltage $\Delta V$ is 200 [V] (that is, ten times as large).

To suppress the surge voltage $\Delta V$ to 20[V] as the same as the case of the normal transistor, it is assumed that, for example, the parasitic inductance of the power source supply line LNs is set to $^1/_{10}$. To do this, however, it is necessary that the cross sectional area of the power source supply line LNs is increased by ten times as large (the current density is made $^1/_{10}$). This may undesirably cause an increase in the layout cost or a considerable restriction on the layout of the printed wiring substrate.

As illustrated in FIG. 9, the surge recirculation line LNr is provided parallelly adjacent to the power source supply line LNs, and both are bridged using the capacitor Cr, such as a surface mounting capacitor (preferably a laminated ceramic capacitor). At this time, the capacitor Cr can easily be mounted, as illustrated, for example, in FIG. 7A. The above-described condition (to suppress the surge voltage $\Delta V$ to 20[V]) is satisfactory, as long as a single or a plurality of approximately 10 [nF] to 1000 [nF] capacitors are arranged, in accordance with the parasitic inductance value of the surge recirculation line LNr. The potential difference between the power source supply line LNs and the surge recirculation line Lnr, at absorption of the surge, is not so large. Thus, the capacitor Cr may be any reasonable or highly available capacitor Cr having a withstand voltage of, for example, approximately 25 to 50 [V]. Similarly, the surge recirculation device DEVh may also be any of those having a withstand voltage of, for example, 25 to 50 [V].

Accordingly, the descriptions have been made to the present invention by the present inventors, based on the preferred embodiments. The present invention is not limited to the above-described embodiments, and various changes maybe made without departing from the scope thereof. For example, the above-described embodiments are explained in details for better understanding of the present invention and are not limited to those including all the configurations described above. A part of the configuration of one embodiment may be replaced with that of another embodiment. The configuration of one embodiment may be added to the configuration of another embodiment. A part of the configuration of each embodiment may be added, deleted, or replaced by that of another configuration.

What is claimed is:

1. A switching device comprising:
a first power source node, a second power source node, and an intermediate node;
a switching transistor which is coupled between the first power source node and the intermediate node;
a recirculation device which is coupled between the second power source node and the intermediate node, and forms a recirculation path when the switching transistor is OFF;
a power source supply line which couples the first power source node with one end of the switching transistor;
a surge recirculation device which causes a current to flow in one direction; and
a surge recirculation line which couples the one end of the switching transistor with the first power source node through the surge recirculation device, and causes a surge generated at the one end of the switching transistor to recirculate toward the first power source node.

2. The switching device according to claim 1, wherein the surge recirculation device is a diode or a diode-coupled transistor.

3. The switching device according to claim 2, further comprising
a single or a plurality of capacitor (s) which couples the power source supply line with a section between the surge recirculation device in the surge recirculation line and the first power source node.

4. The switching device according to claim 3, wherein parasitic inductance of the surge recirculation line is smaller than parasitic inductance of the power source supply line.

5. The switching device according to claim 2, wherein the switching transistor is a GaN transistor or a SiC transistor.

6. The switching device according to claim 2, wherein parasitic inductance of the surge recirculation line is smaller than parasitic inductance of the power source supply line.

7. A switching device comprising:
a wiring substrate which includes a first power source node, a second power source node, and an intermediate node;
a switching transistor which is mounted over the wiring substrate in a manner that it is coupled between the first power source node and the intermediate node;
a recirculation device which is mounted over the wiring substrate in a manner that it is coupled between the second power source node and the intermediate node, and forms a recirculation path when the switching transistor is OFF;
a power source supply line which is formed over the wiring substrate, and couples the first power source node and one end of the switching transistor;
a surge recirculation device which is mounted over the wiring substrate, and causes a current to flow in one direction; and
a surge recirculation line which is formed over the wiring substrate, couples the one end of the switching transistor with the first power source node through the surge recirculation device, and causes a surge generated at the one end of the switching transistor to recirculate toward the first power source node.

8. The switching device according to claim 7, wherein the surge recirculation device is a diode or a diode-coupled transistor.

9. The switching device according to claim 8, wherein the surge recirculation line is arranged in parallel to the power source supply line.

10. The switching device according to claim 9, wherein, further over the wiring substrate, a single or a plurality of capacitors are mounted to couple the power source supply line with a section between the surge recirculation device in the surge recirculation line and the first power source node.

11. The switching device according to claim 10, wherein a cross sectional area of the surge recirculation, line is larger than a cross sectional area of the power source supply line.

12. The switching device according to claim 11,
wherein the power source supply line is formed of a first wiring layer of the wiring substrate;
wherein the surge recirculation line is formed of a second wiring layer which is different from the first wiring layer of the wiring substrate; and.
wherein, when the wiring substrate is transparently seen in plan view, and when a formation region of the surge recirculation line of the second wiring layer is assumed as a first formation region, the power source supply line of the first wiring layer is arranged in a form overlapping a partial region of the first formation region.

13. The switching device according to claim 12,
wherein the surge recirculation line is further formed in the first wiring layer,
wherein, when the wiring substrate is transparently seen in plan view, the surge recirculation line of the first wiring layer is arranged in a form overlapping a region excluding the power source supply line in the first formation region, and
wherein the surge recirculation line of the first wiring layer and the surge recirculation line of the second wiring layer are coupled to each other through a through hole.

14. The switching device according to claim 12,
wherein the first wiring layer and the second wiring layer are adjacent layers between which an insulating layer is formed.

15. The switching device according to claim 8,
wherein the switching transistor is a GaN transistor or a SiC transistor.

16. The switching device according to claim 9,
wherein a cross sectional area of the surge recirculation line is larger than a cross sectional area of the power source supply line.

* * * * *